(12) United States Patent
Nomura et al.

(10) Patent No.: US 7,736,937 B2
(45) Date of Patent: Jun. 15, 2010

(54) MANUFACTURING METHOD OF SOLID-STATE IMAGING DEVICE AND SOLID-STATE IMAGING DEVICE

(75) Inventors: Yuko Nomura, Miyagi (JP); Shinji Uya, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 568 days.

(21) Appl. No.: 11/504,648

(22) Filed: Aug. 16, 2006

(65) Prior Publication Data

US 2007/0042519 A1      Feb. 22, 2007

(30) Foreign Application Priority Data

Aug. 18, 2005   (JP)   ............ P2005-237586

(51) Int. Cl.
*H01L 21/00*   (2006.01)
(52) U.S. Cl. ................. 438/70; 257/E21.544
(58) Field of Classification Search ........... 438/70, 438/208, 220, 414; 257/E21.544
See application file for complete search history.

(56) References Cited

U.S. PATENT DOCUMENTS 6,707,495 B1 *   3/2004   Harada ............ 257/232

2004/0000681 A1   1/2004   Shinohara et al.

FOREIGN PATENT DOCUMENTS

| JP | 11-40794 A | 2/1999 |
| JP | 2000-150848 A | 5/2000 |
| JP | 2004-228140 A | 8/2004 |

* cited by examiner

*Primary Examiner*—Chandra Chaudhari
(74) *Attorney, Agent, or Firm*—Birch, Stewart, Kolasch & Birch, LLP

(57) ABSTRACT

A manufacturing method of a solid-state imaging device, the device comprising: a semiconductor substrate; photodiodes each comprising a surface-side first conductivity type region formed adjacent to a surface of the semiconductor substrate and a second conductivity type region provided directly under the surface-side first conductivity type region; a second conductivity type vertical transfer region provided in the vicinity of the surface-side first conductivity type region; at least one first conductivity type inter-pixel isolation region provided under the vertical transfer region; and at least one first conductivity type overflow barrier region provided below the first conductivity type inter-pixel isolation region, the method comprising: a first step of forming the first conductivity type overflow barrier region in a semiconductor substrate; and a second step of ion-implanting first conductivity type impurity ions from a direction in which channeling tends to occur, to form at least one of the first conductivity type inter-pixel isolation region.

8 Claims, 13 Drawing Sheets

7°-INCLINED IMPLANTATION

0° IMPLANTATION

MANUFACTURING METHOD OF SOLID-STATE IMAGING DEVICE AND SOLID-STATE IMAGING DEVICE

BACKGROUND OF THE INVENTION

1. Field of the Invention

The present invention relates to a manufacturing method of a solid-state imaging device. In particular, the invention relates to a manufacturing method of a solid-state imaging device having a vertical overflow drain structure.

2. Description of the Related Art

CCD solid-state imaging devices and MOS solid-state imaging devices are popular solid-state imaging devices for digital cameras, and solid-state imaging devices of either type employ photodiodes as photodetectors. The photodiodes generate charges in accordance with the quantities of incident light, and carriers of one type (usually electrons) produced by the photoelectric conversion are read out via vertical transfer passages which are CCDs or MOS circuits.

It is desirable to fully remove the storage charges of the photodiodes before a start of shooting. The vertical overflow drain structure capable of fully removing the storage charges of all pixels at the same time is known as a structure of a solid-state imaging device.

In the vertical overflow drain structure, an npn structure is formed in a semiconductor substrate in its depth direction and the storage charges of all pixels can be cleared at the same time by eliminating a potential barrier formed by the middle p-type layer by applying a substrate bias (charge-removal-into-substrate shuttering function).

Furthermore, the potential barrier height can be changed by changing the bias voltage applied to the substrate. And the saturation charge amount of the photodiodes can be changed by changing the potential barrier height.

When receiving strong light, photodiodes generate excess charges above the saturation charge amount. If the excess charges leak into adjacent photodiodes, vertical transfer passages, etc., the image quality of an image taken is deteriorated. An overflow drain that enables removal of only excess charges into the substrate is realized by employing the charge-removal-into-substrate shutter structure and applying a substrate bias so as to leave a potential barrier. The inter-pixel blooming (a phenomenon that excess charges of part of the pixels flow into other pixels, whereby the latter pixels are saturated electrically and the screen looks whitish) can be prevented by sweeping away excess charges above the saturation charge amount into the substrate.

A solid-state imaging device having a vertical overflow drain structure in which an overflow barrier is formed by two p-type layers having different concentrations is proposed to reduce a variation of the saturation charge amounts of the photodiodes (JP-A-2004-228140).

On the other hand, in recent years, a manufacturing method of a solid-state imaging device has come to be employed in which oblique ion implantation is performed to form, with high controllability, an impurity layer at a shallow position in a semiconductor substrate (e.g., JP-A-11-40794).

In recent years, the level of miniaturization of solid-state imaging devices has been increased further, which has produced a tendency that the size of the photodetecting portions (photodiodes) is decreasing (i.e., the area ratio of the photodetecting portions to the vertical transfer regions is decreasing). As a result, each pixel is saturated more easily when receiving strong light. The inter-pixel blooming is thus more prone to occur than before.

To prevent the inter-pixel blooming using the overflow drain, it is necessary to increase the ability to remove excess charges by increasing the sweep-into-substrate voltage. However, if the sweep-into-substrate voltage is increased in a situation that the amount of charge that can be stored in each pixel is decreased by pixel size reduction, it becomes more difficult to secure a necessary amount of charge each pixel can handle (i.e., a necessary saturation charge amount), which is contrary to the intention.

To prevent the inter-pixel blooming without increasing the sweep-into-substrate voltage, it is necessary to increase the impurity concentration of inter-pixel isolation regions (also function as channel stoppers for preventing channel leakage between pixels and vertical transfer gates) provided between pixels and to thereby increase the charge storage amount by indirectly making the potential of the photodetecting portions deeper and enhance the function of preventing formation of charge leakage paths. However, where the impurity concentration of the inter-pixel isolation regions is increased, if high-temperature treatment (for gate oxidation, for example) is performed in a later manufacturing step, the inter-pixel isolation regions spread horizontally, leading to a problem that the area of the photodetecting portions is decreased. Decrease in the area of the photodetecting portions reduces the saturation charge amount of each pixel and makes it difficult to secure a necessary dynamic range.

In the case of solid-state imaging devices for receiving long-wavelength light such as infrared light, carriers are generated in a deep place in the substrate. It is therefore necessary to form plural inter-pixel isolation regions in multiple layers at different positions in the substrate depth direction and to thereby allow the photodetecting portions to effectively take carriers generated in a deep place in the substrate and prevent charge leakage between pixels in the deep place in the substrate. Where plural inter-pixel isolation regions are thus formed in multiple layers at different positions in the substrate, each of the inter-pixel isolation regions spreads horizontally as a result of later heat treatment, leading to decrease in the area of the photodetecting portions as in the above-described case.

SUMMARY OF THE INVENTION

The present invention has been made on the basis of the above consideration, and an object of the invention is therefore to effectively prevent the inter-pixel blooming in solid-state imaging devices which are being increased in miniaturization, while securing necessary areas for the photodetecting portions by suppressing horizontal expansion of the inter-pixel isolation regions without increasing the sweep-into-substrate voltage.

A manufacturing method of a solid-state imaging device according to the invention is a manufacturing method of a solid-state imaging device, wherein the solid-state imaging device comprises: a semiconductor substrate; photodiodes each comprising a surface-side first conductivity type region formed adjacent to a surface of the semiconductor substrate and a second conductivity type region provided directly under the surface-side first conductivity type region; a second conductivity type vertical transfer region provided in the vicinity of the surface-side first conductivity type region; at least one first conductivity type inter-pixel isolation region provided under the vertical transfer region; and at least one first conductivity type overflow barrier region provided below said at least one first conductivity type inter-pixel isolation region, the method comprising: a first step of forming said at least one first conductivity type overflow barrier region in a semiconductor substrate; and a second step of ion-implanting first conductivity type impurity ions from a direction in which channeling tends to occur, to form at least one of said at least one first conductivity type inter-pixel isolation region.

An inter-pixel isolation region is formed above the overflow barrier regions by performing ion implantation from the direction in which channeling tends to occur (hereinafter also referred to as "channeling direction"). In general, impurity ions being ion-implanted into a semiconductor substrate proceed while being changed in traveling direction little by little by repulsive force from atoms (target atoms) constituting the material of the substrate and thereby form periodic wave loci. The channeling is a phenomenon that impurity ions proceed in such a manner as not to collide heavily with target atoms. The channeling greatly depends on the interatomic distance etc. of the target atoms and hence greatly depends on the implantation direction of impurity ions (other factors that influence the channeling are the thermal vibration states of the target atoms and irradiation damage that occurs during the implantation). If ions are implanted from the channeling direction, a deep portion of the substrate can be doped at low implantation energy. As described above, the horizontal size of the inter-pixel isolation regions is shrinking with increase in the level of miniaturization of solid-state imaging devices. On the other hand, as for the depth direction (vertical direction) of the semiconductor substrate, from the viewpoint of securing a necessary charge amount by performing efficient photoelectric conversion even on oblique incident light or securing sufficient sensitivity to long-wavelength incident light (e.g., infrared light), there is a tendency that inter-pixel isolation regions are also formed at rather deep positions in the semiconductor substrate. As a result, the scaling-down in the depth direction (vertical direction) of the semiconductor substrate is not advancing as fast as that in the horizontal direction. That is, whereas the scaling-down of the inter-pixel isolation regions in the horizontal direction is advancing rapidly, that in the vertical direction is not advancing fast. In the invention, with attention paid to the difference between the degrees of scaling-down in the horizontal and vertical directions, an inter-pixel isolation region is formed intentionally from the channeling direction. Usually, the (100)-equivalent surface with less crystal defects is used as the surface of a semiconductor substrate and the channeling direction of the (100) surface is the direction parallel with the normal (perpendicular) to the (100) surface (i.e., the <100> axis direction). Therefore, in general, ion implantation is performed from the direction perpendicular to the (100) surface of the substrate. If ion implantation is performed from the direction perpendicular to the (100) surface of the substrate rather than an inclined direction, impurity ions are introduced into the substrate being controlled accurately by the dimensions of an ion implantation mask without spreading horizontally. Furthermore, as described above, implanting impurity ions from the channel direction enables doping of a deep portion of the substrate at low implantation energy and hence makes it possible to easily form an impurity region whose concentration profile is long in the depth direction of the substrate (or an impurity region located at a deep position in the substrate). Therefore, a synergy effect of the advantages of the perpendicular implantation and the implantation from the channel direction makes it possible to easily form an inter-pixel isolation region that is not spread in the horizontal direction and is sufficiently thick in the depth (vertical) direction (or is located at a deep position in the substrate). In conclusion, in solid-state imaging devices which are being increased in the level of miniaturization, the inter-pixel blooming can be prevented effectively while increase in sweep-into-substrate voltage is not caused and necessary areas for the photodetecting portions are secured by suppressing horizontal expansion of the inter-pixel isolation regions.

In one form of the manufacturing method of a solid-state imaging device according to the invention, a surface of the semiconductor substrate is a (100) crystallographic surface, and to form at least one of said at least one first conductivity type inter-pixel isolation region in the second step, first conductivity type impurity ions are ion-implanted from a direction that coincides with a normal to the surface of the semiconductor substrate.

The above statement is to clarify that the substrate surface is the (100) crystallographic surface and the ion implantation direction is the <100> axis direction which is perpendicular to that surface. Since ion implantation is performed from the direction perpendicular to the substrate surface rather than an inclined direction, impurity ions are introduced into the substrate being controlled accurately by the dimensions of an ion implantation mask without spreading horizontally and an impurity region whose concentration profile is long in the depth direction of the substrate (or an impurity region located at a deep position in the substrate) can be formed easily.

In another form of the manufacturing method of a solid-state imaging device according to the invention, a center of said at least one overflow barrier region is 3 μm or more below the surface of the semiconductor substrate.

In addition to the advantage that the inter-pixel blooming can be prevented effectively while necessary areas for the photodetecting portions are secured by suppressing horizontal expansion of the inter-pixel isolation regions, this feature makes it possible to secure sufficient sensitivity to long-wavelength incident light (near infrared light).

In another form of the manufacturing method of a solid-state imaging device according to the invention, said at least one inter-pixel isolation region comprises a plurality of first conductivity type regions that are located at different positions in a depth direction of the semiconductor substrate.

The structure is employed that the inter-pixel isolation regions are plural first conductivity type regions that are arranged in multiple layers in the depth direction of the semiconductor substrate. These first conductivity type regions play a role of securing a necessary charge amount by helping return minority carriers generated by obliquely incident light to the substrate surface side without sweeping those away to the overflow drain as well as a role of preventing inter-pixel blooming by obstructing movement of charge that is generated in a deep place in the substrate by long-wavelength incident light (e.g., near infrared light). As described above, in the invention, since impurity ions are implanted from the channel direction, a deep portion of the substrate can be doped at low implantation energy. As such, the invention makes it easier to form an impurity region whose concentration profile is long in the depth direction of the substrate (or an impurity region located at a deep position in the substrate) and hence is suitable to form a structure that inter-pixel isolation regions are arranged in multiple layers. Where the structure that the inter-pixel isolation regions are arranged in multiple layers is employed, naturally no problems arise even if ion implantation is performed from the channeling direction because the design dimension in the depth direction (vertical direction) of the substrate has a large margin.

In still another form of the manufacturing method of a solid-state imaging device according to the invention, first conductivity type impurity ions are implanted from a direction in which channeling is not prone to occur to form a deeper one of said at least one first conductivity type inter-pixel isolation region, and first conductivity type impurity ions are implanted from the direction in which channeling tends to occur to form a shallower one of said at least one first conductivity type inter-pixel isolation region.

The first conductivity type regions located at the deep positions in the semiconductor substrate have great influence on the shape of the potential provide of the overflow drain, and hence their positions and thicknesses need to be controlled accurately. For this reason, their positions and thicknesses are controlled accurately by avoiding channeling by using oblique ion implantation (preferably, from a direction that is inclined from the normal to the surface of the semiconductor substrate by 5° to 10°). On the other hand, to prevent charge leakage between pixels, it is desirable that the first conductivity type region located at the shallow position in the substrate have a concentration profile that is long in the depth direction of the substrate. Therefore, it is formed by intentionally performing ion implantation from the channel direction.

In yet another form of the manufacturing method of a solid-state imaging device according to the invention, the semiconductor substrate comprises an epitaxial substrate and an epitaxial layer formed on the epitaxial substrate; and the manufacturing method comprises the steps of: forming, in the epitaxial substrate, the deeper one of said at least one first conductivity type inter-pixel isolation region; forming the epitaxial layer; and forming, in the epitaxial layer, the shallower one of said at least one first conductivity type inter-pixel isolation region.

To secure a sufficient thickness in the depth direction of the semiconductor substrate, the structure in employed that the epitaxial layer is laid on the epitaxial substrate. The inter-pixel isolation regions to be located at the deep positions in the semiconductor substrate are formed in the base epitaxial substrate by oblique ion implantation with high position and layer thickness controllability. The inter-pixel isolation region to be located at the shallow position in the semiconductor substrate is formed in the upper, epitaxial layer by perpendicular ion implantation to obtain an inter-pixel isolation region having sufficient thickness in the depth direction by making good use of the thickness of the epitaxial layer. This feature makes it possible to efficiently form deep inter-pixel isolation regions that are high in position and layer thickness control accuracy and a surface-side inter-pixel isolation region having sufficient thickness in the depth direction.

In another form of the manufacturing method of a solid-state imaging device according to the invention, to form said at least one first conductivity type overflow barrier region in the first step, first conductivity type impurity ions are ion-implanted from a direction that is inclined from the normal to the surface of the semiconductor substrate by a prescribed angle (preferably 5° to 10°).

As described above, whereas the inter-pixel isolation region is formed by perpendicular ion implantation, the overflow barrier regions are formed by oblique ion implantation in such a manner that their positions and thicknesses are controlled with high accuracy by avoiding channeling because they have great influence on the shape of the potential profile and hence their positions and thicknesses need to be controlled accurately.

In another form of the manufacturing method of a solid-state imaging device according to the invention, said at least one first conductivity type overflow barrier region has a multilayer structure, the multilayer structure comprising: an upper, first overflow barrier region; and a lower, second overflow barrier region which is higher in impurity concentration than the first overflow barrier region, and the first and second overflow barrier regions are formed by performing ion implantation from a direction in which channeling is not prone to occur.

Employing the overflow barrier structure consisting of the multiple layers having different impurity concentrations makes it possible to prevent change of the potential barrier height due to a change in sweep-into-substrate voltage and hence to reduce a variation of the saturation charge amounts of the photodiodes. Furthermore, since the overflow barrier regions have great influence on the shape of the potential profile and hence their positions and thicknesses need to be controlled accurately, they are formed by oblique ion implantation in such a manner that their positions and thicknesses are controlled with high accuracy by avoiding channeling.

In a further form of the manufacturing method of a solid-state imaging device according to the invention, the second conductivity type region comprises a plurality of regions having different impurity concentrations.

This feature can increase the sensitivity to long-wavelength incident light of the photodiodes. Since the inter-pixel isolation region is formed accordingly so as to be sufficiently thick in the depth direction of the substrate, there is no risk of charge leakage between pixels.

A solid-state imaging device according to the invention is a solid-state imaging device having a vertical overflow drain structure manufactured by the manufacturing method of a solid-state imaging device according to the invention.

This makes it possible to effectively prevent inter-pixel blooming while securing necessary areas for the photodetecting portions by suppressing horizontal expansion of the inter-pixel isolation regions without increasing the sweep-into-substrate voltage.

DETAILED DESCRIPTION OF THE INVENTION

Embodiments of the present invention will be hereinafter described with reference to the drawings.

First Embodiment

Figure 1:
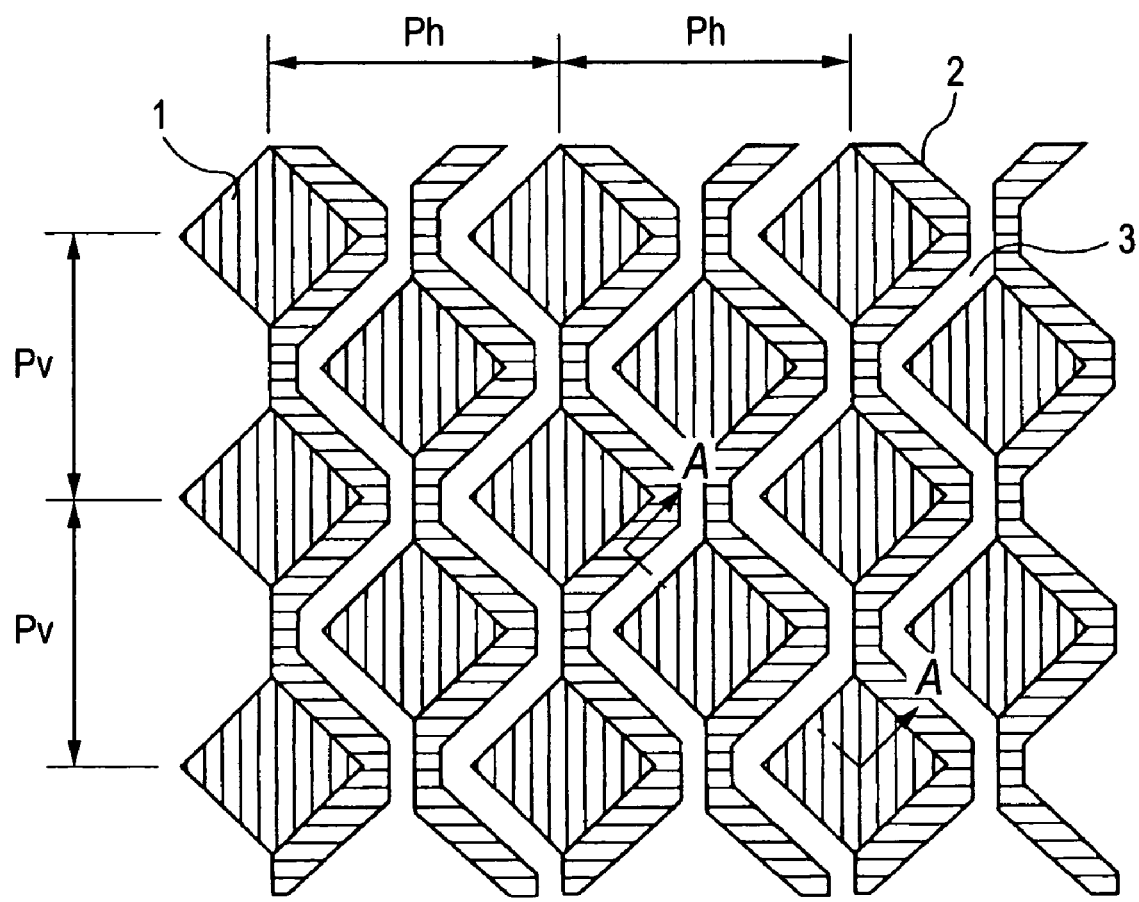
FIG. 1 is a schematic plan view showing the structure of a substrate surface in a solid-state imaging device according to a first embodiment of the present invention.

FIG. 1 is a schematic plan view showing the structure of a substrate surface in an exemplary solid-state imaging device according to the invention.

As shown in FIG. 1, a large number of photodiodes (photodetecting portions, pixel portions) 1 are arranged on the surface of a semiconductor substrate in plural columns and plural rows at constant pitches Ph and Pv. FIG. 1 is a simplified view, and in an actual device hundreds to thousands of photodiodes 1 are arranged in each column or row. Each photodiode 1 stores charge of an amount corresponding to a quantity of light received.

The photodiodes 1 belonging to the even-numbered columns are deviated from those belonging to the odd-numbered columns by about ½ of the pitch Pv of the photodiodes 1 of each column, and the photodiodes 1 belonging to the even-numbered rows are deviated from those belonging to the odd-numbered rows by about ½ of the pitch Ph of the photodiodes 1 of each row. A staggered pixel arrangement (honeycomb arrangement) is thus produced. Each photodiode column includes photodiodes 1 belonging to only the odd-numbered or even-numbered rows, and each photodiode row includes photodiodes 1 belonging to only the odd-numbered or even-numbered columns.

Plural vertical transfer regions 2 are formed on the surface of the semiconductor substrate between the adjoining photodiode columns. Each vertical transfer region 2 is coupled to the left-hand photodiodes 1 (as viewed in FIG. 1) and snakes so as to extend in the column direction. Each of plural isolation regions 3 snakes so as to extend in the column direction and to isolate those combinations of a vertical transfer region 2 and photodiodes 1 which belong to the associated columns. The arrangement of the photodiodes 1 is not to the above one and may be of a square lattice form.

Figure 2:
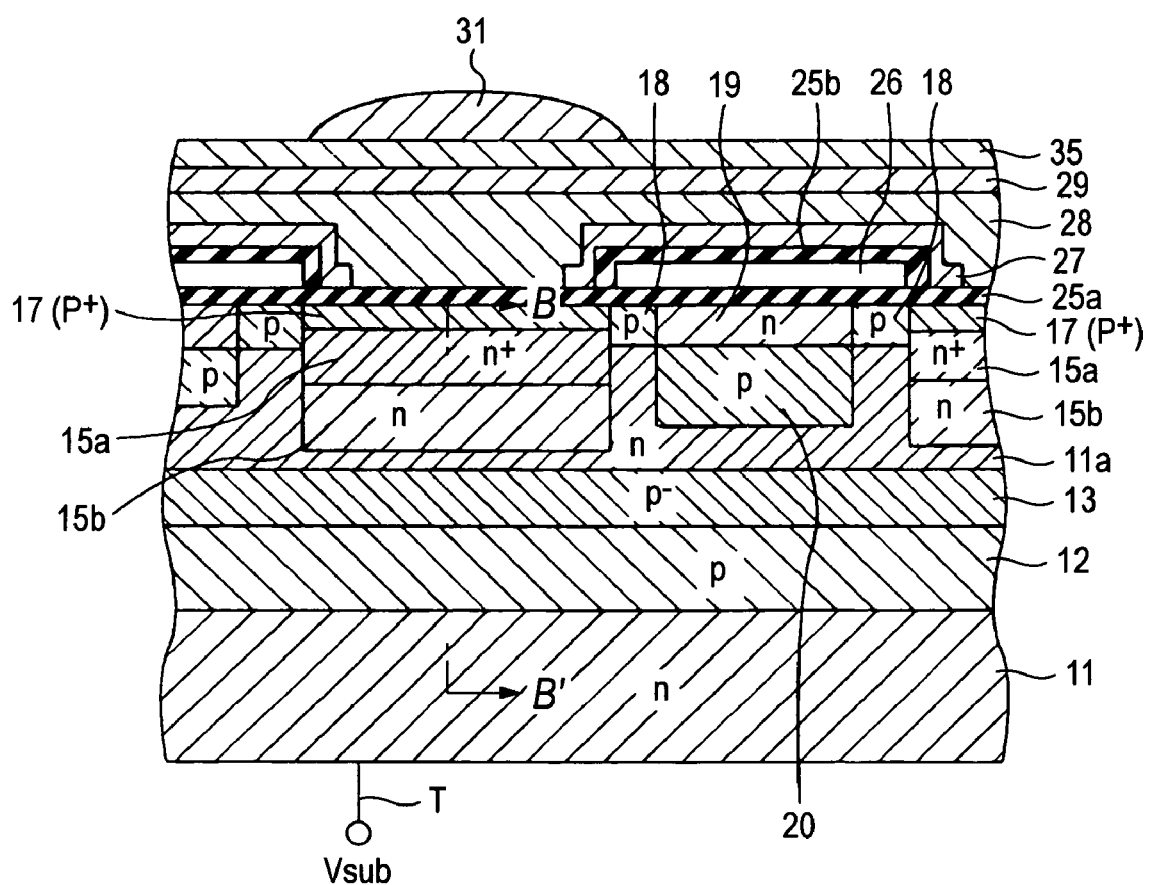
FIG. 2 is a schematic sectional view of a photodiode 1 and neighboring regions etc. taken along line A-A' in FIG. 1 parallel with the substrate thickness direction.

FIG. 2 is a schematic sectional view of a photodiode 1 and neighboring regions etc. taken along line A-A' in FIG. 1 parallel with the substrate thickness direction. As shown in FIG. 2, a light shield film, microlenses, etc. are formed on the substrate surface.

A semiconductor substrate 11 is made of n⁻ silicon and has an impurity concentration of $6.0 \times 10^{14}$ cm$^{-3}$, for example. A sweep-into-substrate voltage Vsub is applied to the substrate 11 via an overflow drain terminal T.

A first overflow barrier region (hereinafter may be referred to simply as "barrier region") 12 which is a p-type region is formed in the semiconductor substrate 11. For example, the first barrier region 12 is formed by ion-implanting a p-type impurity such as B (boron) at a dose of $2.0 \times 10^{11}$ to $5.0 \times 10^{11}$ cm$^{-2}$ at implantation energy of 1.5 to 2.5 MeV. A second barrier region 13 which is a p-type region and is low in impurity concentration than the first barrier region 12 is formed on the first barrier region 12. For example, the second barrier region 13 is formed by ion-implanting a p-type impurity such as B obliquely (i.e., from such a direction that channeling is not prone to occur; described later) at a dose of $1.0 \times 10^{11}$ to $3.0 \times 10^{11}$ cm$^{-2}$ at implantation energy of 1.0 to 2.0 MeV.

The first barrier region 12 and the second barrier region 13 form a potential barrier which determines the amount of charge that can be stored in each photodiode 1. As described later with reference to FIGS. 8A to 8D, the potential barrier height is lowered by increasing the substrate voltage in the positive direction. If the potential barrier height is lowered, the saturation charge amount of each photodiode 1 decreases.

When strong light shines on photodiodes 1, excess charges above the saturation charge amount are generated. If the excess charges leak into other photodiodes 1 etc., pixels become whitish there (blooming) and the image quality is deteriorated. It is possible to cause the generated excess charges to go over the potential barrier and be swept away into the n-type substrate 11 by adjusting the potential barrier height by setting the sweep-into-substrate voltage Vsub properly (vertical overflow drain structure). The blooming can thus be prevented.

If the substrate voltage applied varies from one photodiode 1 to another, the photodiode saturation charge amount also does so. This leads to various kinds of trouble; for example, the saturation charge amount becomes smaller than a desired value to decrease the dynamic range, or unnecessary charges are not swept away into the substrate 11 but leak into other photodiodes 1 to cause blooming.

Therefore, it is desirable that the photodiode saturation charge amount not vary to a large extent even when the substrate voltage changes. As described later with reference to FIGS. 8A to 8D and 9, according to this embodiment, forming the second barrier region 13 in addition to the first barrier region 12 makes it possible to prevent the photodiode saturation charge amount from changing rapidly due to a change in substrate voltage.

An n⁻ region 11a formed on the second barrier region 13 is an n⁻ region of the semiconductor substrate. An n-type region 15 (15a and 15b) is formed in the n⁻ region 11a. The photodiode 1 includes the n-type region 15 (15a and 15b), the n⁻ region 11a, and the p-type, first and second barrier regions 12 and 13. The charge storage region of the photodiode 1 includes the n-type region 15 (15a and 15b) and the n⁻ region 11a. For example, the n-type region 15 (15a and 15b) is formed by ion-implanting an n-type impurity such as P (phosphorus) or As (arsenic) at a dose of $1.0 \times 10^{12}$ to $3.0 \times 10^{12}$ cm$^{-2}$ at implantation energy of 200 to 700 keV.

The reason why the n-type region 15 constituting the photodiode 1 has the multilayer structure consisting of the upper, high-concentration region 15a and the lower, low-concentration region 15b is to secure sufficient photodetection sensitivity to long-wavelength light.

A high-concentration (p$^+$) surface region 17 is formed on the surface side of the n-type region 15 (15a and 15b) to bury the n-type region 15 (15a and 15b). Separated from the substrate surface, the n-type region 15 (15a and 15b) is less prone to be influenced by the states of the surface. For example, the p$^+$ surface region 17 is formed by ion-implanting a p-type impurity such as B (boron) at a dose of $1.0 \times 10^{14}$ to $3.0 \times 10^{14}$ cm$^{-2}$ at implantation energy of 10 to 50 keV.

A P-type regions 18 is formed adjacent to the n-type region 15. For example, the p-type regions 18 is formed by ion-implanting a p-type impurity such as B at a dose of $1.0 \times 10^{12}$ to $3.0 \times 10^{12}$ cm$^{-2}$ at implantation energy of 10 to 100 keV. An n-type, VCCD vertical transfer region 19 is formed adjacent to the p-type region 18 on its side opposite to the n-type region 15 (15a and 15b). The p-type region 18 not only functions as a potential barrier between the vertical transfer region 19 and the n-type region 15 (15a and 15b) which is part of the charge storage region of the photodiode 1, but also serves for electrical isolation between the associated photodiode columns.

For example, the vertical transfer region 19 is formed by ion-implanting an n-type impurity such as P or As at a dose of $3.0 \times 10^{12}$ to $7.0 \times 10^{12}$ cm$^{-2}$ at implantation energy of 50 to 200 keV.

A p-type deep inter-pixel isolation region 20 (also functions as a channels top region) is formed directly under the vertical transfer region 19. For example, the inter-pixel isolation region 20 is formed by ion-implanting a p-type impurity such as B at a dose of $1.0 \times 10^{11}$ to $5.0 \times 10^{11}$ cm$^{-2}$ at implantation energy of 400 keV to 1.0 MeV. The inter-pixel isolation region 20 can prevent inter-pixel blooming by preventing charge transfer between the adjacent pixels (photodiodes 1). The inter-pixel isolation region 20 can also prevent a smear (i.e., a phenomenon that excess charges flow into a vertical transfer passage in the midst of a vertical transfer, whereby a white vertical band appears in an image) by preventing leakage of unnecessary charges from photodiodes 1 to the vertical transfer region 19.

An insulating film 25a made of silicon oxide, for example, is formed on the surface of the vertical transfer region 19 etc., and a vertical transfer electrode 26 made of polysilicon, for example, is formed on the insulating film 25a. The vertical transfer electrode 26 extends so as to cover the p-type region 18 that is located between the n-type region 15 and the vertical transfer region 19. At the time of charge reading, a positive voltage is applied to the vertical transfer electrode 26, whereby the potential barrier formed by the p-type region 18 is lowered and charge is read from the n-type region 15 to the vertical transfer region 19.

An insulating film 25b made of silicon oxide, for example, is formed so as to cover the vertical transfer electrode 26, and a light shield film 27 made of W (tungsten), for example, is formed on the surface of the insulating film 25b. The light shield film 27 has an opening over the n-type region 15 (15a and 15b). Incident light enters only the photodiode 1 because of the light shield effect of the light shield film 27.

A planarization film 28 made of polyimide, for example, is formed so as to cover the light shield film 27, whereby a flat surface is formed.

A filter layer of red (R), green (G), blue (B), or the like (color filter layer 29) is formed on the surface of the planarization film 28. Another planarization film 35 is formed on the color filter layer 29, whereby a flat surface is formed. A microlens 31 is provided on the planarization film 35. For example, the microlens 31 is formed by exposing and developing a photoresist film into a pattern having a lens planar shape and producing a lens shape by rendering the surface portion of the photoresist film flowable by softening the surface portion by heating.

One important feature of the invention is the method of forming the inter-pixel isolation region 20 by ion implantation. However, the presence of the two barrier regions 12 and 13 below the inter-pixel isolation region 20 is also an important part of the structure of the solid-state imaging device according to this embodiment. Therefore, first, the function of the two barrier layers 12 and 13 will be described with reference to FIGS. 8A to 8D and 9.

FIGS. 8A to 8D show impurity concentration profiles and potential profiles in the depth direction of the solid-state imaging device according to the first embodiment. The horizontal axis of FIGS. 8A to 8D represents the position (μm) in the depth direction, that is, on line B-B' in FIG. 2. The vertical axes represent the impurity concentration and the potential (V). The impurity concentration means the number of carriers per cubic centimeters (common logarithmic scale).

As seen from the potential profiles of FIGS. 8A to 8D, the n-type region 15 and the n⁻ region 11a form a potential well, the bottom of which exists in the n-type region 15.

The potential of the potential well increases as the position goes toward the top of the n-type region 15 or the bottom of the n⁻ region 11a. The second barrier region 13 and the first barrier region 12, both of which are a p-type region, form a potential barrier for electrons stored in the potential well.

Charge is stored in the region from the bottom of the potential well which is formed by the n-type regions and the peak of the potential barrier which is formed by the p-type regions, and excess charge can be discarded to the n-type substrate 11 (vertical overflow drain structure).

Figure 8A:
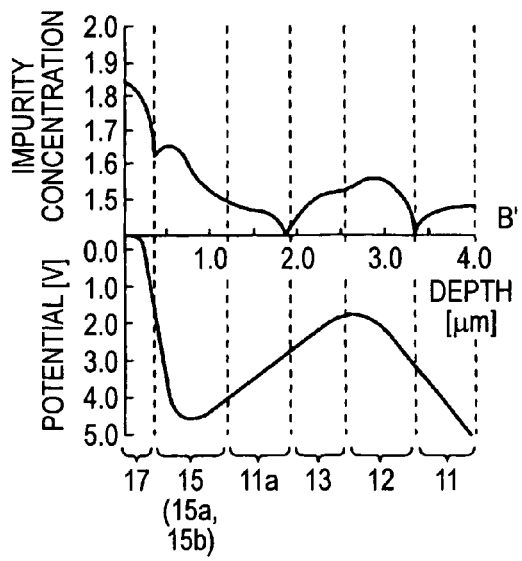
FIGS. 8A-8D show impurity concentration profiles and potential profiles in the depth direction of the solid-state imaging device according to the first embodiment.
Figure 8C:
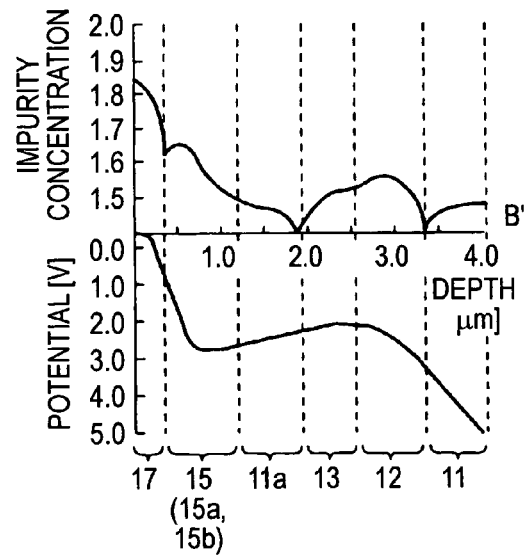
Figure 8B:
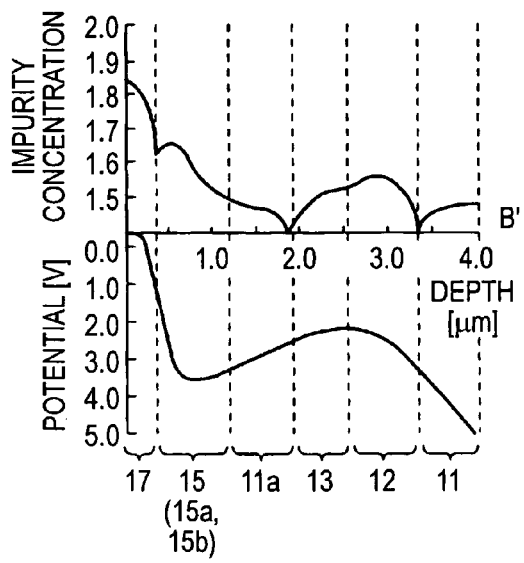
Figure 8D:
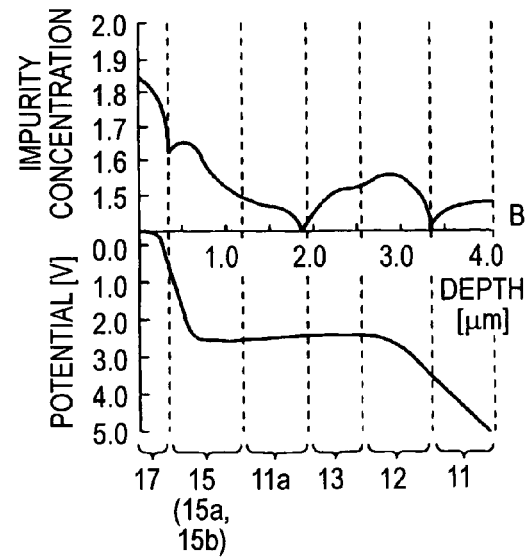

As shown in the top part of FIG. 8A, for example, the concentration profile of the p-type impurity for forming the potential barrier is the sum of a bell-shaped impurity concentration profile of the first barrier region 12 and a bell-shaped impurity concentration profile of the second barrier region 13, the latter having a lower peak than the former. Setting the impurity concentration of the second barrier region 13 too high is not preferable because the potential well becomes so narrow that the saturation charge amount becomes unduly small: the impurity concentration of the second barrier region 13 should be set such that the decrease in saturation charge amount is practically allowable.

The potential profiles of FIGS. 8A to 8D are different from each other in the bias voltage applied to the substrate. That is, the substrate voltage increases in the positive direction in order of FIGS. 8A to 8D.

As the substrate voltage increases, the potential of the n-type substrate 11 decreases and the potential barrier that is formed by the first and second barrier regions 12 and 13 lowers. On the other hand, almost no change occurs in the position of the bottom of the potential well that is formed by the n-type region 15 because it is away from the n-type substrate 11. Therefore, the energy difference between the peak of the potential barrier and the bottom of the potential well decreases as the substrate voltage increases. That is, the amount of charge that can be stored in the potential well decreases in order of FIGS. 8A to 8D. The saturation charge amount of the diode 1 thus decreases as the substrate voltage increases.

If the substrate voltage is increased to such a value (or higher) that the potential barrier disappears from a state that charge is stored in the photodiode 1, the stored charge of the photodiode 1 can be removed into the n-type substrate 11 (charge-removal-into-substrate shuttering).

Figure 9:
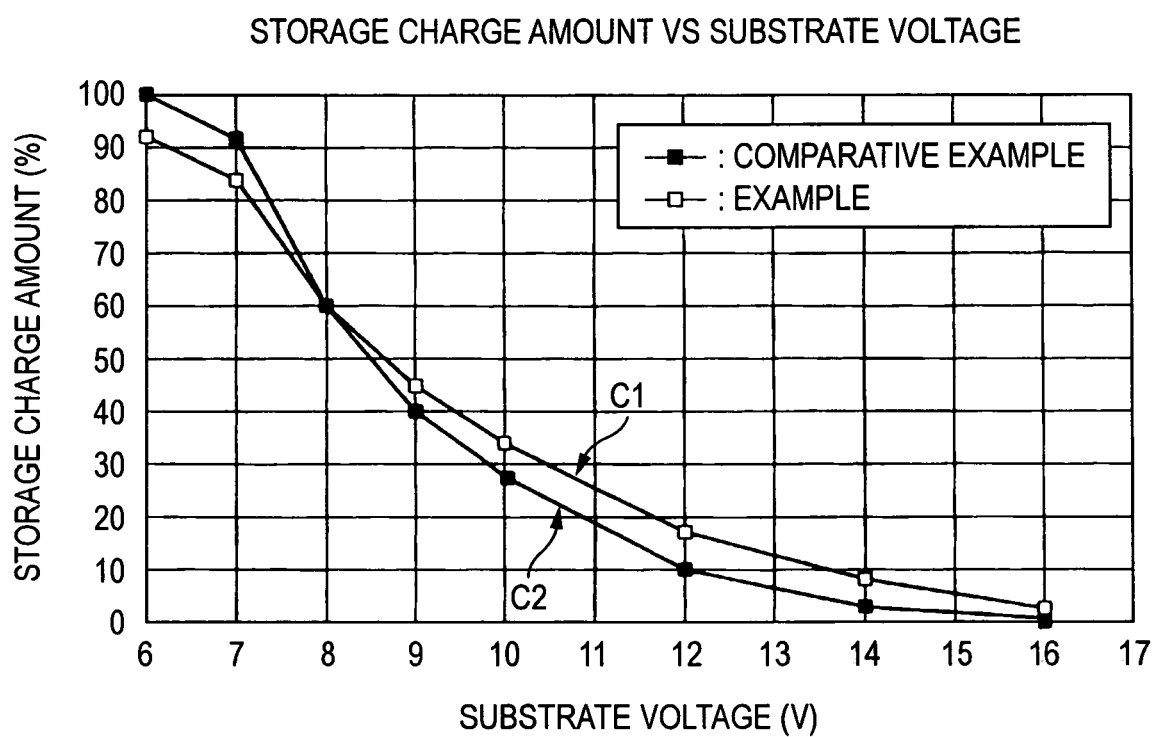
FIG. 9 is a graph showing a relationship between the substrate voltage and the photodiode saturation charge amount of a solid-state imaging device having a two-layer overflow barrier and a comparative solid-state imaging device having a single-layer overflow barrier.

FIG. 9 is a graph showing a relationship between the substrate voltage and the photodiode saturation charge amount of a solid-state imaging device having a two-layer overflow barrier and a comparative solid-state imaging device having a single-layer overflow barrier. In FIG. 9, curves C1 and C2 correspond to the device of the example and the device of the comparative example, respectively. In FIG. 9, the saturation charge amount is in percentage in which a saturation charge amount that is obtained when a substrate voltage of 6 V is applied to the device of the comparative example is regarded as 100%. In both of the solid-state imaging device of the example and the solid-state imaging device of the comparative example, the substrate voltage is set at 8 V, for example, in ordinary shooting. The two solid-state imaging devices are set so as to have approximately the same saturation charge amount when the substrate voltage is equal to 8 V.

In both characteristic curves C1 and C2 of the solid-state imaging device of the example and the solid-state imaging device of the comparative example, the saturation charge amount decreases as the substrate voltage increases. However, curve C1 decreases more gently than curve C2. In particular, around the substrate voltage 8V which is used in ordinary shooting, whereas curve C2 (comparative example) decreases from about 92% to about 40% (52% decrease) as the substrate voltage increases from 7 V to 9 V, curve C1 (example) decreases from about 85% to about 45% (only 40% decrease). It is therefore understood that the solid-state imaging device of the example can suppress change of the photodiode saturation charge amount due to a change in substrate voltage. In the device of the example, the saturation charge amount can be made 0% by applying a substrate voltage of 25 V. A charge-removal-into-substrate shuttering operation is performed with the substrate voltage set at 25 V.

As described above, the structure of FIG. 2 having the second barrier region 13 can reduce a variation of the saturation charge amounts of the photodiodes 1 due to a variation in substrate voltage. As a result, the photodiodes 1 can be prevented from decreasing in dynamic range and the blooming can be prevented.

Next, how to form the inter-pixel isolation region 20 by ion implantation (i.e., use of a suitable ion implantation method) will be described with reference to FIGS. 3-7.

Figure 3:
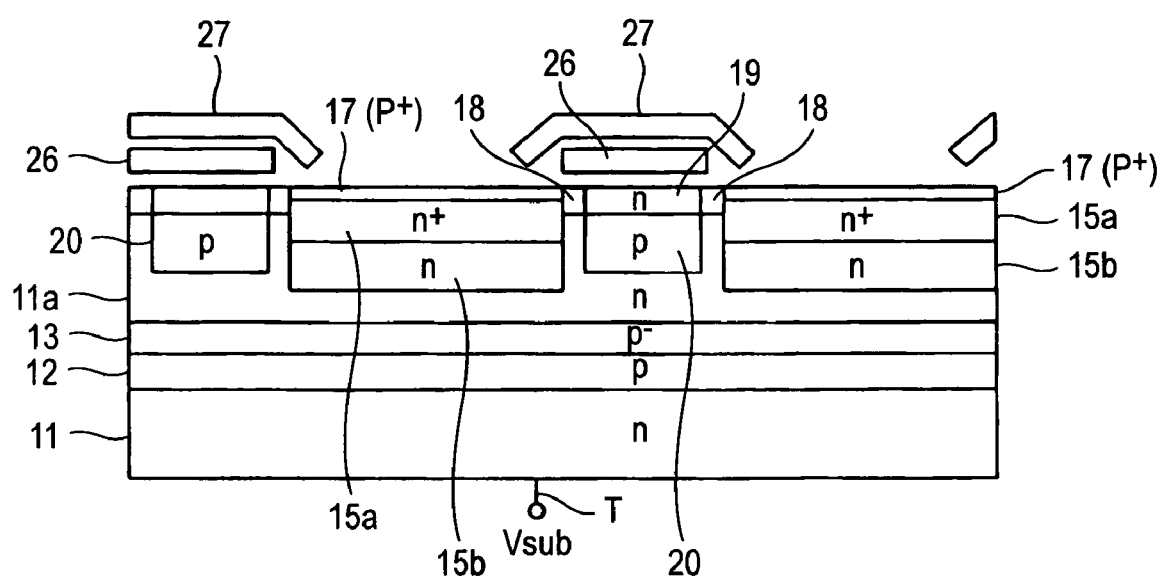
FIG. 3 is a simplified sectional view, corresponding to FIG. 2, of the solid-state imaging device in which the lens etc. formed on the surface of the semiconductor substrate are omitted.

FIG. 3 is a simplified sectional view, corresponding to FIG. 2, of the solid-state imaging device in which the lens etc. formed on the surface of the semiconductor substrate are omitted. FIG. 3 employs the same reference symbols as FIG. 2 does, and the structure of the solid-state imaging device shown in FIG. 3 is the same as in FIG. 2.

That is, the solid-state imaging device shown in FIG. 3 has the two overflow barrier regions 12 and 13 and the n-type region 15 of the photodiode 1 has the two-layer structure (regions 15a and 15b). As such, the solid-state imaging device shown in FIG. 3 is designed so as to be sufficiently sensitive to long-wavelength light such as near infrared light.

As a feature corresponding to the feature that the n-type region 15 of the photodiode 1 has the two-layer structure and hence has a sufficient thickness in the depth direction, the p-type inter-pixel isolation region 20 (also serves as the channel stop region) which is located directly under the vertical transfer region 19 is thicker in the depth direction than in the conventional case.

Next, a manufacturing method of the solid-state imaging device shown in FIG. 3 will be described with reference to FIGS. 4A to 4D. FIGS. 4A to 4D are device sectional views showing important steps of a manufacturing method of the solid-state imaging device shown in FIG. 3. In FIGS. 4A to 4D, regions etc. having corresponding ones in FIGS. 2 and 3 are given the same reference symbols as the latter.

Figure 4A:
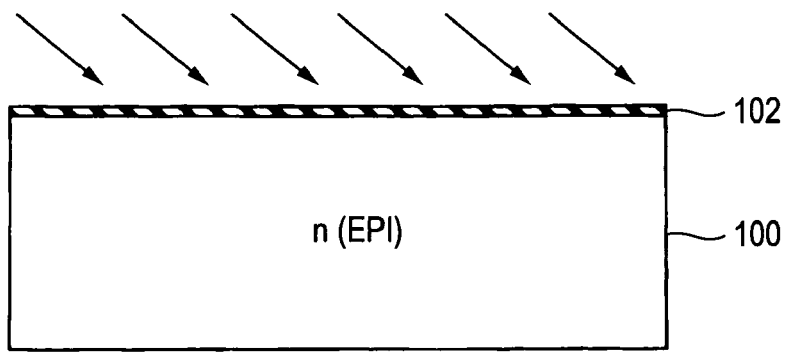
FIGS. 4A-4D are sectional views showing important steps of a manufacturing method of the solid-state imaging device shown in FIG. 3.

As shown in FIG. 4A, after a thin oxide film 102 is formed on a (100)-equivalent surface of an epitaxial silicon substrate 100, boron (B) is introduced into the epitaxial substrate 100 by performing oblique ion implantation from a direction that is inclined by 7° from the normal to the (100) surface (i.e., from the <100> crystallographic axis direction) and in which almost no channeling occurs. This implantation of impurity ions is performed to form two barrier regions 12 and 13. Therefore, the impurity ion concentration is changed and the implantation position is controlled accurately with consideration given to intended positions of the barrier regions 12 and 13 in the depth direction and their intended impurity concentrations (the barrier region 13 is lower in impurity concentration than the barrier region 12).

As described above with reference to FIGS. 8A to 8D and 9, the positions and thicknesses of the barrier regions 12 and 13 greatly influence the potential profile of a resulting overflow drain structure. Therefore, they should be controlled accurately. This is the reason why oblique ion implantation is performed from the direction that is inclined by 7° from the <100> axis direction in which channeling is prone to occur.

Figure 4B:
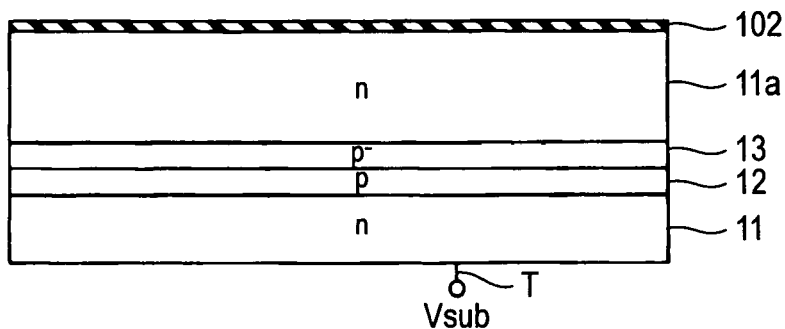

Then, activation processing is performed for the introduced impurity, whereby two barrier regions 12 and 13 are formed as shown in FIG. 4B.

Figure 4C:
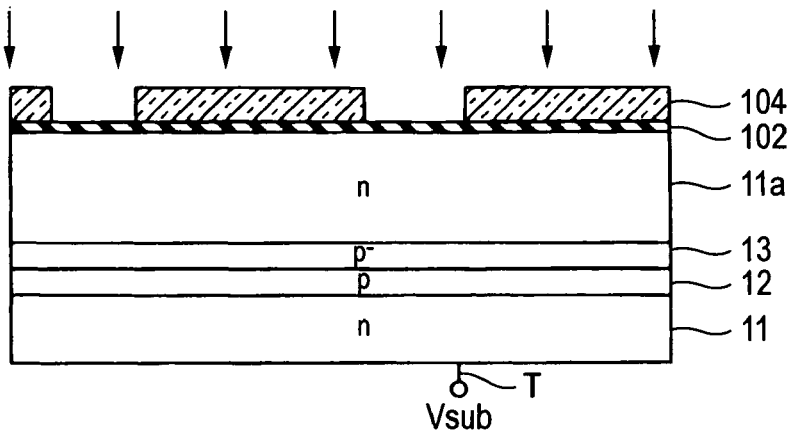

Then, as shown in FIG. 4C, an ion implantation mask 104 is formed on the epitaxial substrate 100 by photolithography. Boron (B) ion implantation is performed from the direction that coincides with the normal to the (100) surface (0° direction).

Figure 4D:
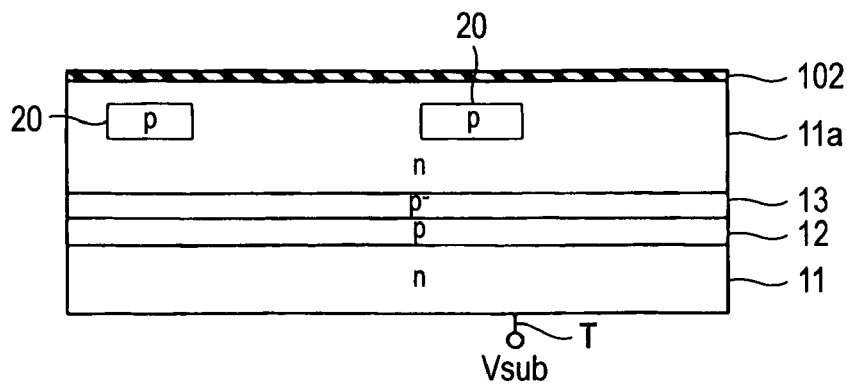

Then, the implanted impurity ions are activated, whereby an inter-pixel isolation region 20 having a necessary thickness in the depth direction is formed as shown in FIG. 4D without any difficulty.

Figure 5A:
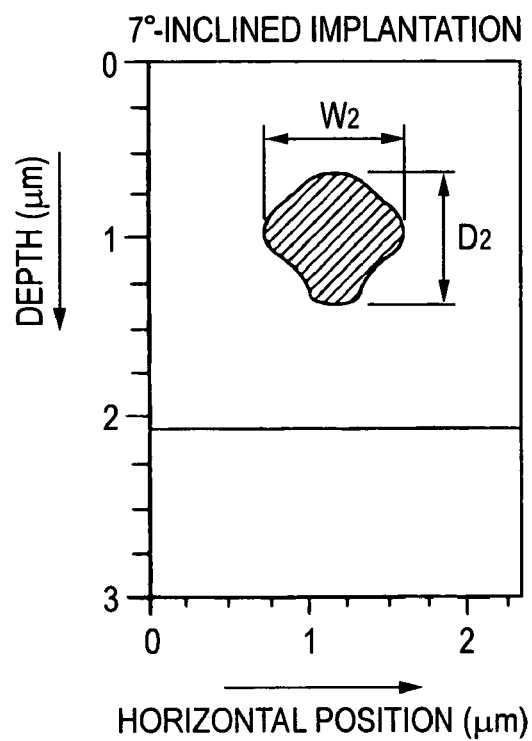
FIG. 5A shows a simulation result of impurity concentration distributions in the depth direction and the width direction (horizontal direction) immediately after ion implantation and corresponds to a case that boron (B) oblique ion implantation is performed from the 7°-inclined direction (as in a step of FIG. 13C of a manufacturing method of a comparative example)
Figure 5B:
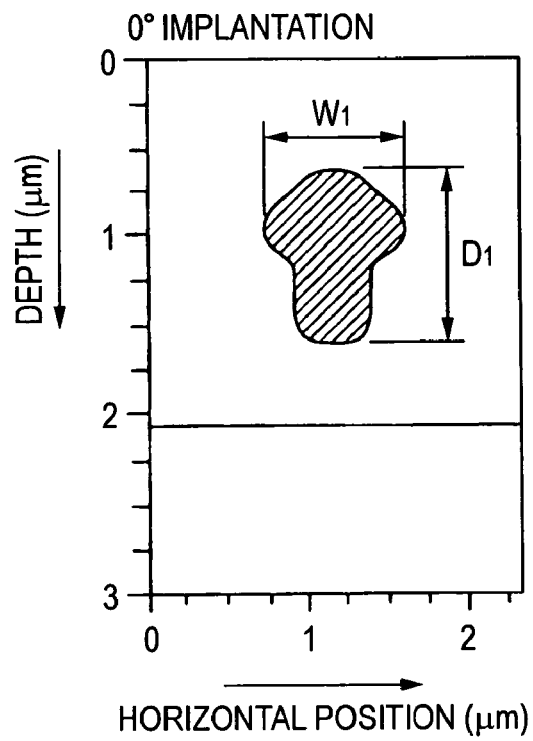
FIG. 5B shows a simulation result of impurity concentration distributions in the depth direction and the width direction (horizontal direction) immediately after ion implantation and corresponds and corresponds to a case that boron (B) ion implantation is performed from the 0° direction.

FIGS. 5A and 5B show simulation results of impurity concentration distributions in the depth direction and the horizontal direction immediately after ion implantation. FIG. 5A corresponds to a case that boron (B) oblique ion implantation is performed from the 7°-inclined direction (as in a step of FIG. 13C of a manufacturing method of a comparative example), and FIG. 5B corresponds to a case that boron (B) ion implantation is performed from the 0° direction as shown in FIG. 4C.

As is understood from the comparison between the impurity concentration distributions of FIGS. 5A and 5B, in the case of the 0° implantation (FIG. 5B, the impurity concentration distribution has a very narrow horizontal width W1 and a great width D1 in the depth direction (i.e., impurity ions reach a very deep position).

In contrast, in the comparative example of FIG. 5A (7°-inclined ion implantation), the impurity concentration distribution has a very wide horizontal width W2 (>W1) and a width D2 (<D1) in the depth direction (i.e., impurity ions reach only a shallow region). These comparison results show that performing ion implantation from the direction perpendicular to the (100) surface (0° direction) in which channeling occurs makes it possible to form an impurity region having a necessary thickness in the depth direction at low implantation energy while suppressing horizontal expansion of impurity ions, without any difficulty.

Figure 6A:
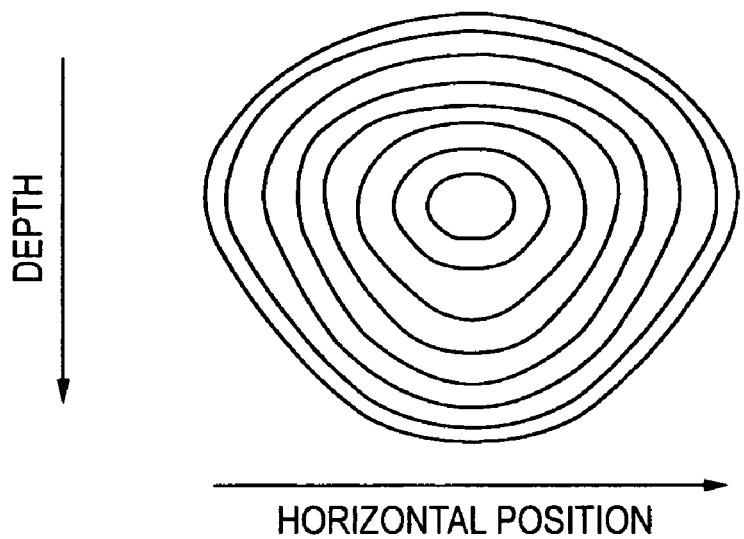
FIG. 6A shows an impurity concentration distribution obtained after heat treatment (heat treatment equivalent to thermal oxidation processing for formation of a gate oxide film is assumed here) that is performed after the ion implantation and corresponds to the 0° implantation.
Figure 6B:
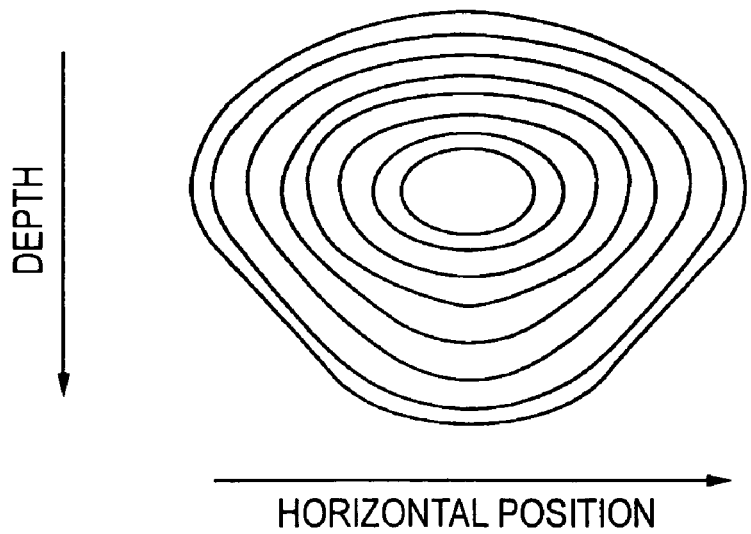
FIG. 6B shows an impurity concentration distribution obtained after heat treatment (heat treatment equivalent to thermal oxidation processing for formation of a gate oxide film is assumed here) that is performed after the ion implantation and corresponds to the 7°-inclined implantation.

FIGS. 6A and 6B show impurity concentration distributions obtained after heat treatment (heat treatment equivalent to thermal oxidation processing for formation of a gate oxide film is assumed here) that is performed after the ion implantation. FIG. 6A corresponds to the 0° implantation and FIG. 6B corresponds to the 7°-inclined implantation. Closed lines in FIGS. 6A and 6B are equiconcentration lines.

As is understood from the comparison with the impurity concentration distributions of FIGS. 5A and 5B, the heat treatment increases the width in both of the horizontal and depth directions. However, it is apparent that the impurity concentration distribution of the 0° ion implantation (FIG. 6A) is narrower in the horizontal direction and wider in the depth direction than that of the 7°-inclined ion implantation (FIG. 6B).

Figure 7:
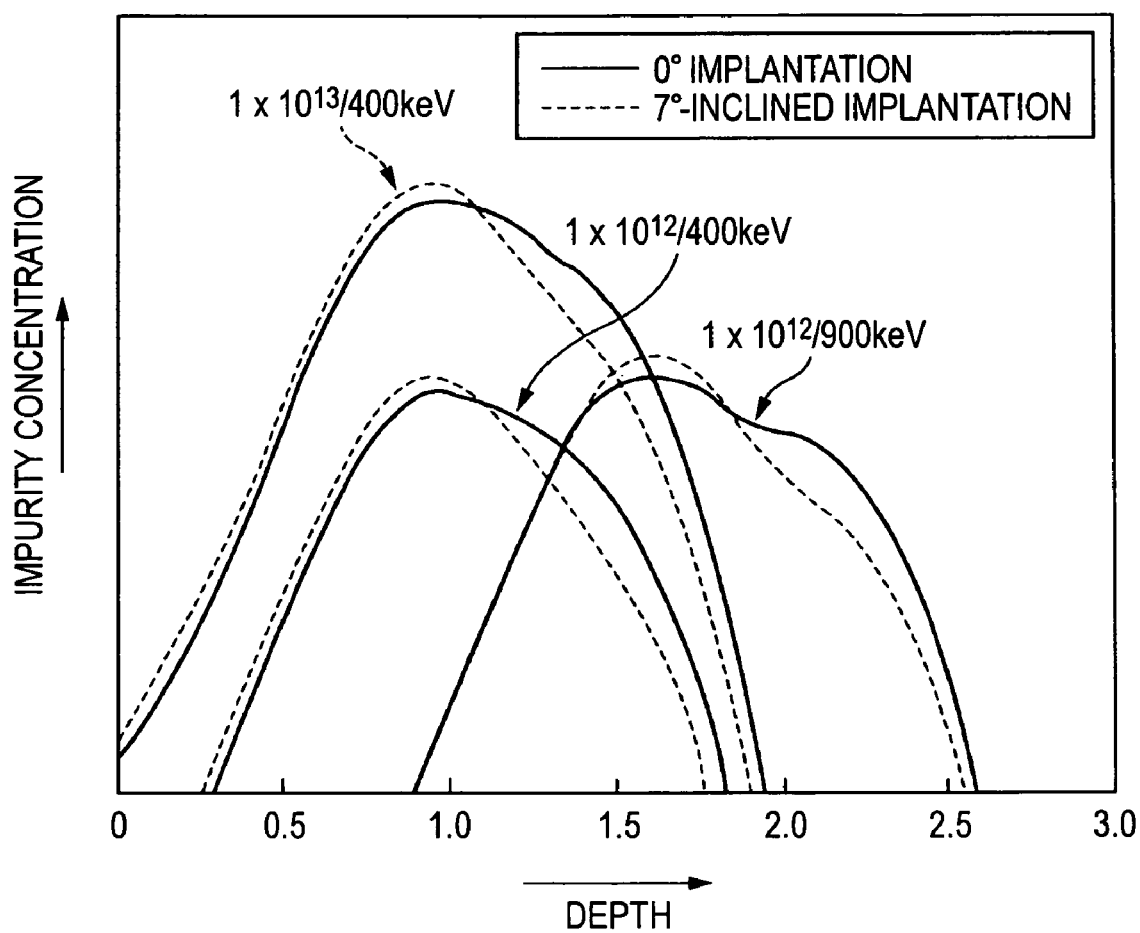
FIG. 7 shows a result of an experiment in which boron (B) ion implantation was performed and an impurity concentration profile in the substrate depth direction was checked while the ion implantation energy was varied.

FIG. 7 shows a result of an experiment in which boron (B) ion implantation was performed and an impurity concentration profile in the substrate depth direction was checked while the ion implantation energy was varied.

In FIG. 7, broken lines indicate concentration profiles of 7°-inclined implantation and solid lines indicate concentration profiles of 0° implantation. It is seen that for every implantation energy the concentration profile of the 0° implantation extends to a deeper position than that of the 7°-inclined implantation.

The above result shows that performing ion implantation from the direction that coincides with the normal to the (100) surface and in which channeling occurs (0° implantation) makes it possible to form an impurity region having a necessary thickness in the depth direction at low implantation energy while suppressing horizontal expansion of impurity ions, without any difficulty.

FIGS. 13A to 13D are device sectional views showing important steps of a manufacturing method (of a comparative example) in which an inter-pixel isolation region 20 is formed by 7°-inclined ion implantation corresponding to FIG. 5A.

Figure 13A:
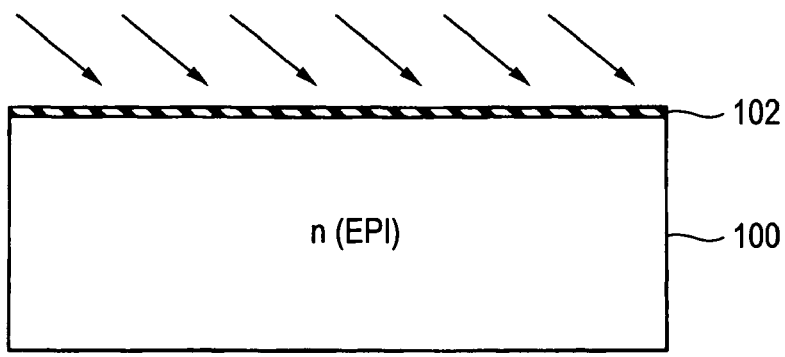
FIG. 13A-13D are device sectional views showing important steps of a manufacturing method of a solid-state imaging device of a comparative example in which an inter-pixel isolation region (reference numeral 20) is formed by 7°-inclined ion implantation corresponding to FIG. 5A.
Figure 13B:
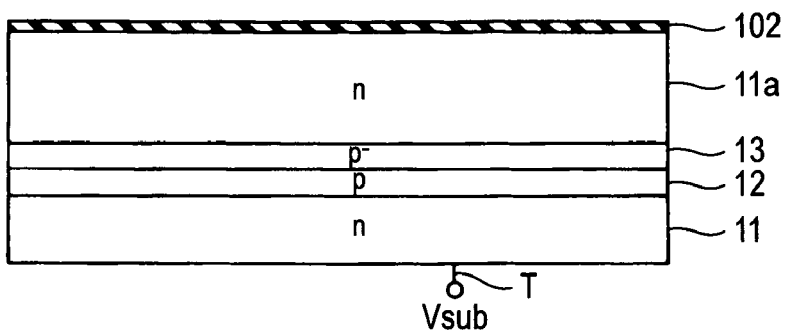

FIGS. 13A-13D correspond to FIGS. 4A-4D, respectively, and FIGS. 13A and 13B are the same as FIGS. 4A and 4B.

Figure 13C:
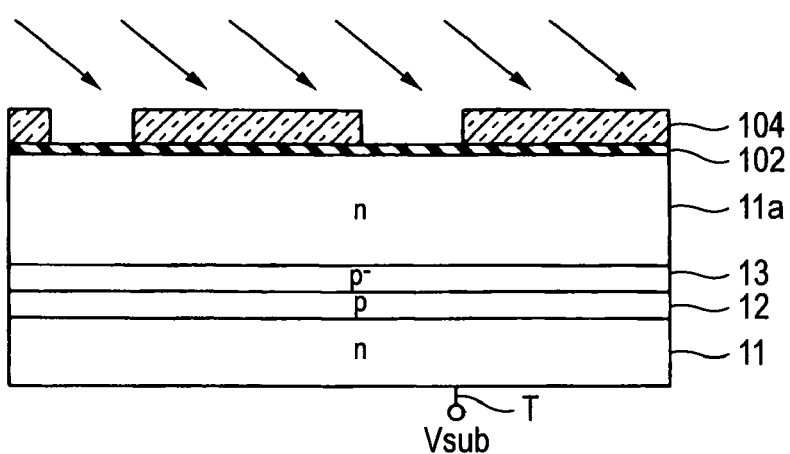
Figure 13D:
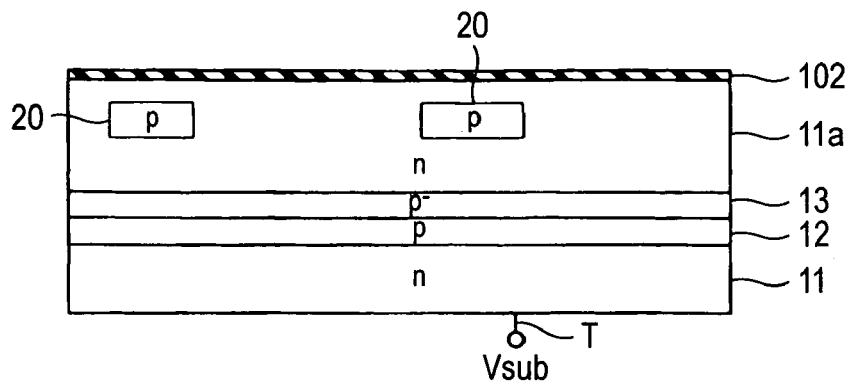

The step of FIG. 13C is different from the step of FIG. 4C in that oblique ion implantation is performed from the 7°-inclined direction. In the step of FIG. 13D, the horizontal width of the inter-pixel isolation region 20 is greater than that of the inter-pixel isolation region 20 shown in FIG. 4D. As a result, the area of the photodiode 1 is reduced and the detection light quantity is decreased accordingly. Further, this manufacturing method is disadvantageous when it is intended to form an inter-pixel isolation region 20 having a necessary thickness in the depth direction.

As described above, in the manufacturing method of a solid-state imaging device according to this embodiment, attention is paid to the difference between the degree of scaling-down in the horizontal direction and that in the depth direction. The inter-pixel isolation region is formed by intentionally performing ion implantation from the direction in which channeling tends to occur by positively utilizing the fact that strict dimensional accuracy is required in the horizontal direction but a certain margin is available for a vertical design dimension to secure sufficient long-wavelength sensitivity, for example. This makes it possible to efficiently form, at low implantation energy, an inter-pixel isolation region that is narrow in the horizontal direction and has a sufficient thickness in the vertical direction.

Therefore, this embodiment makes it possible to prevent the pixel size (pixel area) from being reduced forcibly (by horizontal expansion of the inter-pixel isolation region) and to prevent inter-pixel blooming by preventing charge leakage between pixels reliably while securing high sensitivity in a long-wavelength range.

Second Embodiment

Next, a second embodiment of the invention will be described with reference to FIGS. 10-12.

Figure 10:
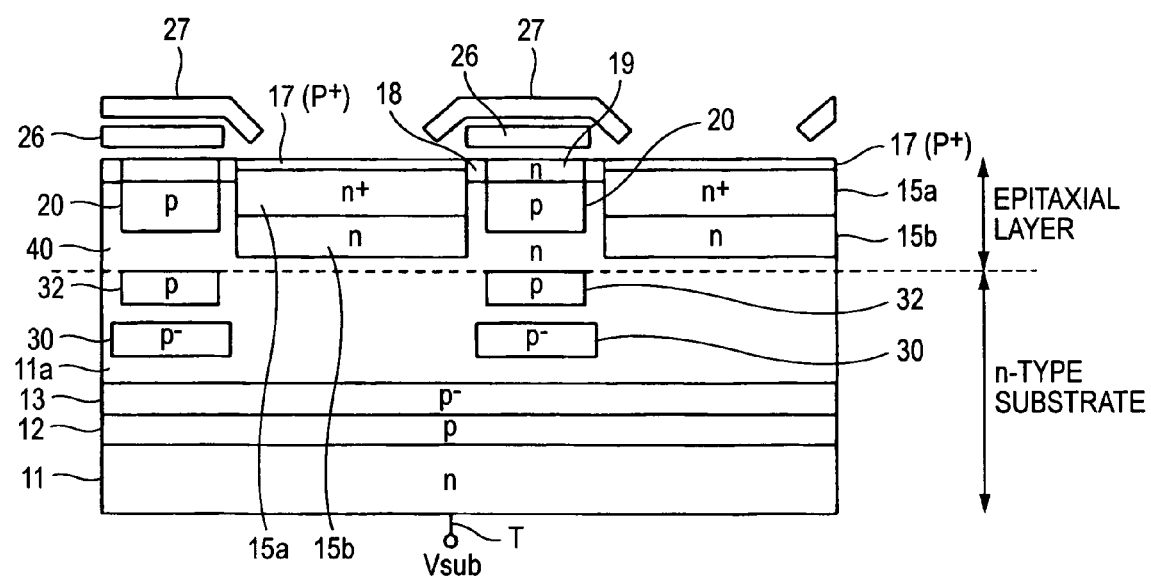
FIG. 10 is a sectional view showing the structure of an important part of a solid-state imaging device manufactured by a manufacturing method according to a second embodiment of the invention (an epitaxial layer is laid on an n-type epitaxial substrate and plural inter-pixel isolation regions are formed in multiple layers)

FIG. 10 is a sectional view showing the structure of an important part of a solid-state imaging device manufactured by a manufacturing method according to the second embodiment of the invention (an epitaxial layer is laid on an n-type epitaxial substrate and plural inter-pixel isolation regions are formed in multiple layers).

FIG. 10 corresponds to FIG. 3, and regions etc. having corresponding ones in FIG. 3 are given the same reference symbols as the latter. The structure of the solid-state imaging device shown in FIG. 10 is characterized in that an epitaxial layer 40 is laid on an n-type epitaxial substrate (i.e., the portion under a broken line in FIG. 10 and a margin in the depth direction is thereby increased (to secure sufficient sensitivity to long-wavelength light), and that plural impurity regions (20, 30, and 32) arranged in multiple layers serve as inter-pixel isolation regions and the impurity concentration profile in the depth direction right under the vertical transfer region 19 is more complex than in the first embodiment.

The semiconductor substrate can be given a sufficient thickness in the depth direction by laying the epitaxial layer 40 on the epitaxial substrate.

The inter-pixel isolation regions 30 and 32 which should be located at deep positions in the semiconductor substrate are formed in the base epitaxial substrate by oblique ion implantation with high position and layer thickness controllability. That is, since the inter-pixel isolation regions located at deep positions in the semiconductor substrate have great influence on the shape of the potential profile of the overflow drain, their positions of formation and thicknesses need to be controlled accurately. For this reason, they are formed by oblique ion implantation, whereby their positions of formation and thicknesses are controlled with high accuracy by avoiding channeling.

The inter-pixel isolation region 20 which should be located at a shallow position in the semiconductor substrate is formed, as an inter-pixel isolation region having a sufficient thickness in the depth direction, in the upper, epitaxial layer 40 by performing ion implantation from the direction perpendicular to the substrate surface by making good use of the thickness of the epitaxial layer 40. That is, ion implantation is intentionally performed from the direction in which channeling occurs, because it is desirable that to prevent charge leakage between pixels the inter-pixel isolation region 20 which should be located at a shallow position in the semiconductor substrate be formed as an impurity region whose concentration distribution is long in the depth direction of the substrate.

As described above, the inter-pixel isolation regions 20, 30, 32 are formed by using the ion implantation methods suitable for them, respectively, whereby the inter-pixel isolation regions 30 and 32 are formed efficiently at deep positions with high position and layer thickness control accuracy and the surface-side inter-pixel isolation region 20 is formed efficiently so as to be sufficiently thick in the depth direction.

FIG. 11A-11D are device sectional views showing important steps (to an epitaxial substrate forming step) of a manufacturing method of the solid-state imaging device shown in FIG. 10. In FIG. 11A-11D, regions etc. having corresponding ones in the figures referred to above are given the same reference symbols as the latter.

Figure 11A:
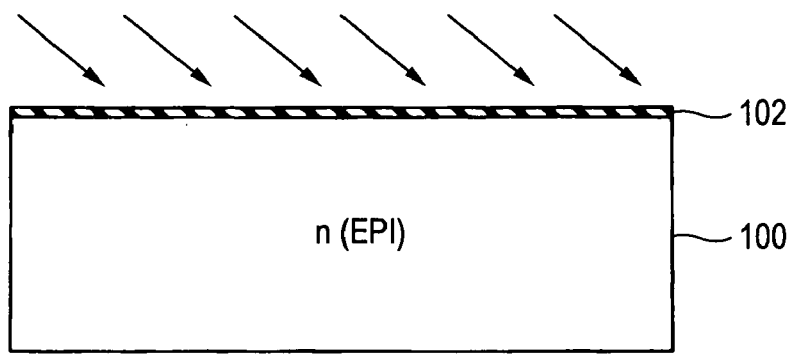
FIGS. 11A-11D are device sectional views showing important steps (to an epitaxial substrate forming step) of a manufacturing method of the solid-state imaging device shown in FIG. 10.

As shown in FIG. 11A, after a thin oxide film 102 is formed on a (100)-equivalent surface of an epitaxial silicon substrate 100, boron (B) is introduced into the epitaxial substrate 100 by performing oblique ion implantation from a direction that is inclined by 7° from the normal to the (100) surface (i.e., from the <100> crystallographic axis direction) and in which almost no channeling occurs. This implantation of impurity ions is performed to form two barrier regions 12 and 13. Therefore, the impurity ion concentration is changed and the implantation position is controlled accurately with consideration given to intended positions of the barrier regions 12 and 13 in the depth direction and their intended impurity concentrations (the barrier region 13 is lower in impurity concentration than the barrier region 12).

As described above with reference to FIGS. 8A to 8D and 9, the positions and thicknesses of the barrier regions 12 and 13 greatly influence the potential profile of a resulting overflow drain structure. Therefore, they should be controlled accurately. This is the reason why oblique ion implantation is performed from the direction that is inclined by 7° from the <100> axis direction in which channeling is prone to occur.

Figure 11B:
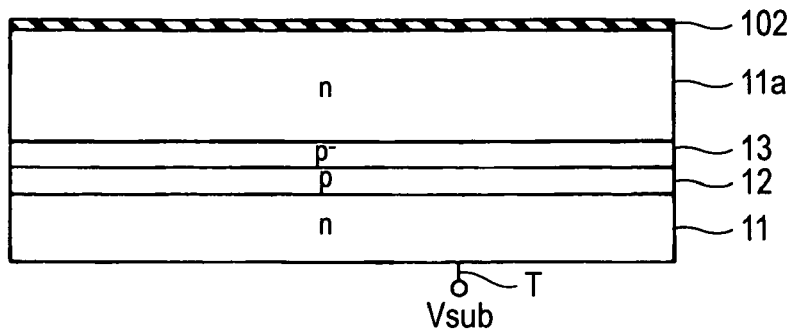
Figure 11C:
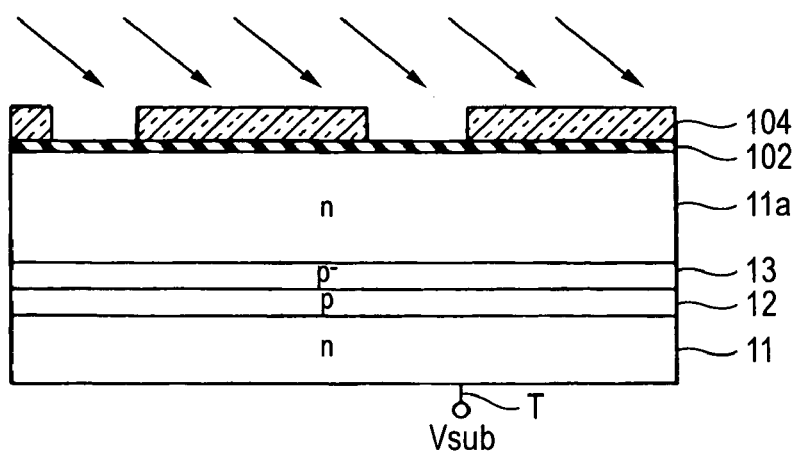

Then, activation processing is performed for the introduced impurity, whereby two barrier regions 12 and 13 are formed as shown in FIG. 11B.

Then, as shown in FIG. 1C, an ion implantation mask 104 is formed on the epitaxial substrate 100 by photolithography. Boron (B) ion implantation is performed from a direction inclined from the substrate surface by 7°. This implantation of impurity ions is performed to form inter-pixel isolation regions 30 and 32. Therefore, the impurity ion concentration is changed and the implantation position is controlled accurately with consideration given to intended positions of the inter-pixel isolation regions 30 and 32 in the depth direction and their intended impurity concentrations (the inter-pixel isolation region 30 is lower in impurity concentration than the inter-pixel isolation region 32).

Figure 11D:
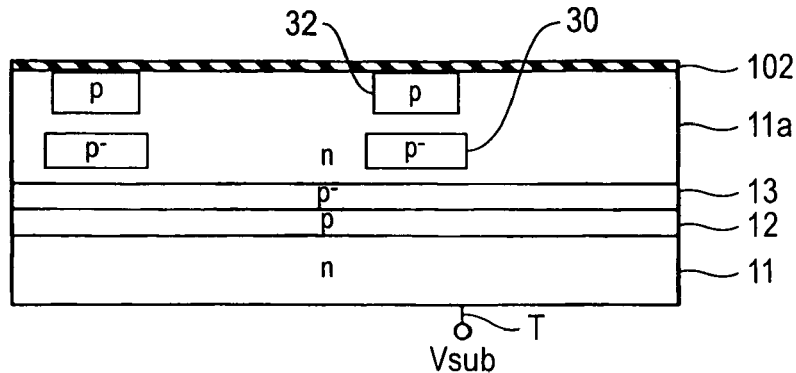

Then, the implanted impurity ions are activated, whereby inter-pixel isolation regions 30 and 32 formed so as to overlap with each other as shown in FIG. 11D.

FIGS. 12E-12H are device sectional views showing important steps (i.e., steps of laying an epitaxial layer on the epitaxial substrate and forming an inter-pixel isolation region in the epitaxial layer) of the manufacturing method of the solid-state imaging device shown in FIG. 10. In FIGS. 12E-12H, regions etc. having corresponding ones in the figures referred to above are given the same reference symbols as the latter.

Figure 12E:
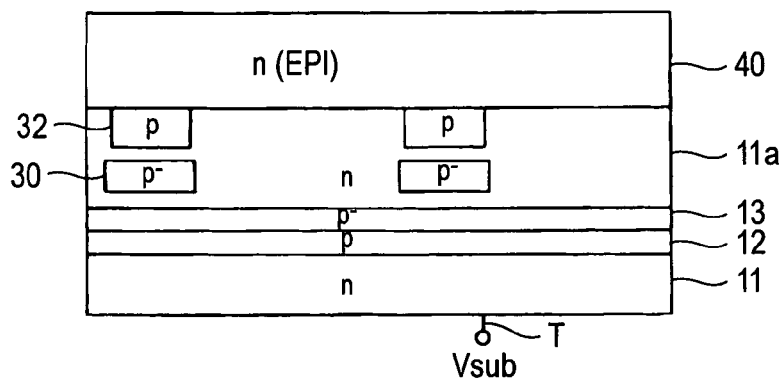
FIGS. 12E-12H are device sectional views showing important steps (i.e., steps of laying an epitaxial layer on the epitaxial substrate and forming an inter-pixel isolation region in the epitaxial layer) of the manufacturing method of the solid-state imaging device shown in FIG. 10.

As shown in FIG. 12E, an epitaxial layer 40 is laid on the epitaxial substrate.

Figure 12F:
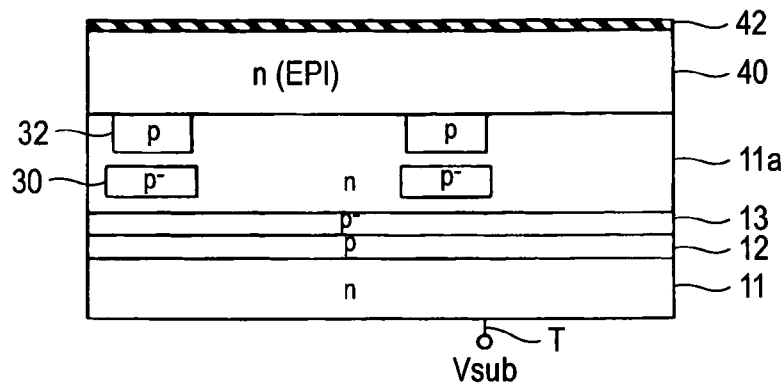

As shown in FIG. 12F, a surface oxide film (i.e., surface protection oxide film for ion implantation) 42 is formed on the epitaxial layer 40.

Figure 12G:
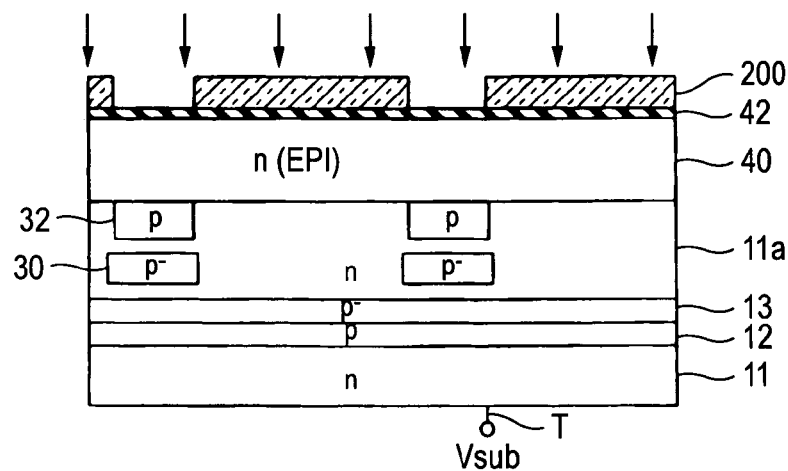

Then, as shown in FIG. 12G, boron (B) ion implantation is performed from the direction perpendicular to the substrate surface. Impurity ions that are implanted in this step are to form an inter-pixel isolation region 20.

Figure 12H:
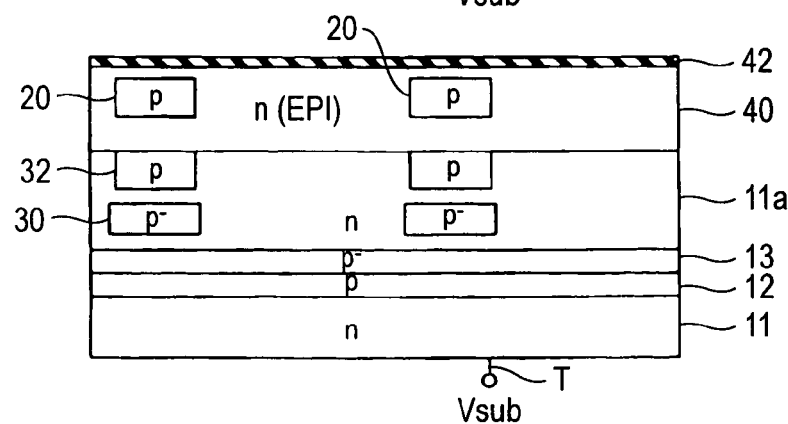

Then, as shown in FIG. 12H, the impurity ions are activated by heat treatment, whereby an inter-pixel isolation region 20 having a necessary thickness in the depth direction is formed in the epitaxial layer 40.

As described above, the inter-pixel isolation regions are plural impurity regions that are formed in multiple layers at different positions in the depth direction of the substrate. In particular, this structure can attain both of effective use of carriers that are generated in a deep place upon incidence of long-wavelength light and reliable prevention of charge leakage between pixels in the deep place (i.e., prevention of inter-pixel blooming).

Among the inter-pixel isolation regions that are plural impurity regions arranged in multiple layers, the inter-pixel isolation regions that are close to the back surface of the substrate are formed by oblique ion implantation with high position and thickness accuracy with consideration given to the fact that they greatly influence the shape of the potential profile of the overflow drain. On the other hand, the surface-side inter-pixel isolation region is formed by perpendicular ion plantation so as to be sufficiently thick in the depth direction. This makes it possible to reliably prevent charge leakage between pixels even in the case of reception of long-wavelength light while fully utilizing the charge-removal-into-substrate shuttering function and the blooming prevention function of the overflow drain.

Furthermore, to secure a sufficient semiconductor thickness for detection of long-wavelength light, the epitaxial layer is laid on the epitaxial substrate and the inter-pixel isolation region(s) is provided in each of the epitaxial substrate and the epitaxial layer (oblique ion implantation is performed on the epitaxial substrate and perpendicular ion implantation is performed on the epitaxial layer). This allows the solid-state imaging device to have sufficient sensitivity to long-wavelength light and makes it possible to utilize the overflow drain without any difficulty and to prevent inter-pixel blooming reliably.

As described above, the manufacturing method of a solid-state imaging device according to the invention provides the following advantages.

That is, in the invention, attention is paid to the difference between the degree of scaling-down in the horizontal direction and that in the depth direction. The inter-pixel isolation region is formed by intentionally performing ion implantation from the direction in which channeling tends to occur in the case where strict dimensional accuracy is required in the horizontal direction but a certain margin is available for a vertical design dimension to secure sufficient long-wavelength sensitivity, for example. This makes it possible to efficiently form inter-pixel isolation region that is narrow in the horizontal direction and has a sufficient thickness in the vertical direction.

Therefore, this embodiment makes it possible to prevent the pixel size (pixel area) from being reduced forcibly (by horizontal expansion of the inter-pixel isolation regions) and to prevent inter-pixel blooming by preventing charge leakage between pixels reliably while securing high sensitivity in a long-wavelength range.

In particular, the inter-pixel isolation regions are plural impurity regions that are formed in multiple layers at different positions in the depth direction of the substrate. In particular, this structure can attain both of effective use of carriers that are generated in a deep place upon incidence of long-wavelength light and reliable prevention of charge leakage between pixels in the deep place (i.e., prevention of inter-pixel blooming).

Among the inter-pixel isolation regions that are plural impurity regions formed in multiple layers, the inter-pixel isolation regions that are close to the back surface of the substrate are formed by oblique ion implantation with high position and thickness accuracy with consideration given to the fact that they greatly influence the shape of the potential profile of the overflow drain. On the other hand, the surface-side inter-pixel isolation region is formed by perpendicular ion plantation so as to be sufficiently thick in the depth direction. This makes it possible to reliably prevent charge leakage between pixels even in the case of reception of long-wavelength light while fully utilizing the charge-removal-into-substrate shuttering function and the blooming prevention function of the overflow drain.

Furthermore, to secure a sufficient semiconductor thickness for detection of long-wavelength light, the epitaxial layer is laid on the epitaxial substrate and the inter-pixel isolation region(s) is provided in each of the epitaxial substrate and the epitaxial layer (oblique ion implantation is performed on the epitaxial substrate and perpendicular ion implantation is performed on the epitaxial layer). This allows the solid-state imaging device to have sufficient sensitivity to long-wavelength light and makes it possible to utilize the overflow drain without any difficulty and to reliably prevent inter-pixel blooming.

In forming the overflow barrier regions in the bottom portion of the semiconductor substrate, the shape of the potential profile, for example, of the overflow drain can be controlled with high accuracy by controlling the positions and thicknesses of the barrier regions with high accuracy by performing oblique ion implantation intentionally.

Forming, as the overflow barrier regions, plural regions having different impurity concentrations in multiple layers makes it possible to effectively reduce a variation of the saturation charge amounts of the photodetecting portions.

As described above, each impurity region is formed by performing ion implantation in a direction suitable for its properties and roles; for example, oblique ion implantation is performed for the overflow barrier regions and perpendicular ion implantation is performed for the prescribed inter-pixel isolation region. This makes it possible to efficiently manufacture a miniaturized solid-state imaging device which is also sensitive to long-wavelength light, can maintain a sweep-into-substrate voltage properly, and can prevent inter-pixel blooming reliably.

The invention can provide a miniaturized solid-state imaging device which can secure necessary areas for photodetecting portions without increasing the sweep-into-substrate voltage, can prevent inter-pixel blooming effectively, and has high sensitivity to long-wavelength light.

In the manufacturing method of a solid-state imaging device according to the invention, attention is paid to the difference between the degree of scaling-down in the horizontal direction and that in the depth direction. The inter-pixel isolation region is formed by intentionally performing ion implantation from the direction in which channeling tends to occur in the case where strict dimensional accuracy is required in the horizontal direction but a certain margin is available for a vertical design dimension to secure sufficient long-wavelength sensitivity, for example. This makes it possible to efficiently form inter-pixel isolation region that is narrow in the horizontal direction and has a sufficient thickness in the vertical direction.

Therefore, this embodiment makes it possible to prevent the pixel size (pixel area) from being reduced forcibly (by horizontal expansion of the inter-pixel isolation regions) and to prevent inter-pixel blooming by preventing charge leakage between pixels reliably while securing high sensitivity in a long-wavelength range.

In particular, the inter-pixel isolation regions are plural impurity regions that are formed in multiple layers at different positions in the depth direction of the substrate. In particular, this structure can attain both of effective use of carriers that are generated in a deep place upon incidence of long-wavelength light and reliable prevention of charge leakage between pixels in the deep place (i.e., prevention of inter-pixel blooming).

Among the inter-pixel isolation regions that are plural impurity regions formed in multiple layers, the inter-pixel isolation regions that are close to the back surface of the substrate are formed by oblique ion implantation with high position and thickness accuracy with consideration given to the fact that they greatly influence the shape of the potential profile of the overflow drain. On the other hand, the surface-side inter-pixel isolation region is formed by perpendicular ion plantation so as to be sufficiently thick in the depth direction. This makes it possible to reliably prevent charge leakage between pixels even in the case of reception of long-wavelength light while fully utilizing the charge-removal-into-substrate shuttering function and the blooming prevention function of the overflow drain.

Furthermore, to secure a sufficient semiconductor thickness for detection of long-wavelength light, the epitaxial layer is laid on the epitaxial substrate and the inter-pixel isolation region(s) is provided in each of the epitaxial substrate and the epitaxial layer (oblique ion implantation is performed on the epitaxial substrate and perpendicular ion implantation is performed on the epitaxial layer). This allows the solid-state imaging device to have sufficient sensitivity to long-wavelength light and makes it possible to utilize the overflow drain without any difficulty and to reliably prevent inter-pixel blooming.

In forming the overflow barrier regions in the bottom portion of the semiconductor substrate, the shape of the potential profile, for example, of the overflow drain can be controlled with high accuracy by controlling the positions and thicknesses of the barrier regions with high accuracy by performing oblique ion implantation intentionally.

Forming, as the overflow barrier regions, plural regions having different impurity concentrations in multiple layers makes it possible to effectively reduce a variation of the saturation charge amounts of the photodetecting portions.

As described above, each impurity region is formed by performing ion implantation in a direction suitable for its properties and roles; for example, oblique ion implantation is performed for the overflow barrier regions and perpendicular ion implantation is performed for the prescribed inter-pixel isolation region. This makes it possible to efficiently manufacture a miniaturized solid-state imaging device which is also sensitive to long-wavelength light, can maintain a sweep-into-substrate voltage properly, and can prevent inter-pixel blooming reliably.

The invention can provide a miniaturized solid-state imaging device which can secure necessary areas for photodetecting portions without increasing the sweep-into-substrate voltage, can prevent inter-pixel blooming effectively, and has high sensitivity to long-wavelength light.

The invention makes it possible to efficiently manufacture a miniaturized solid-state imaging device which can secure necessary areas for photodetecting portions without increasing the sweep-into-substrate voltage, can prevent inter-pixel blooming effectively, and has high sensitivity to long-wavelength light. As such, the invention provides a useful manufacturing method of a solid-state imaging device (formed by CCDs, MOS elements, or the like) which uses ion implantation.

The entire disclosure of each and every foreign patent application from which the benefit of foreign priority has been claimed in the present application is incorporated herein by reference, as if fully set forth.

What is claimed is:

1. A manufacturing method of a solid-state imaging device, wherein the solid-state imaging device comprises:
   a semiconductor substrate;
   photodiodes each comprising a surface-side first conductivity type region formed adjacent to a surface of the semiconductor substrate and a second conductivity type region provided directly under the surface-side first conductivity type region;
   a second conductivity type vertical transfer region provided in the vicinity of the surface-side first conductivity type region;
   at least one first conductivity type inter-pixel isolation region provided under the vertical transfer region; and
   at least one first conductivity type overflow barrier region provided below said at least one first conductivity type inter-pixel isolation region,
   wherein said at least one first conductivity type inter-pixel isolation region comprises a plurality of first conductivity type regions that are located at different positions in a depth direction of the semiconductor substrate,
   the method comprising:
      a first step of forming said at least one first conductivity type overflow barrier region in a semiconductor substrate; and
      a second step of ion-implanting first conductivity type impurity ions from a first direction in which channeling occurs, to form at least one of said at least one first conductivity type inter-pixel isolation region.

2. The manufacturing method of a solid-state imaging device according to claim 1,
   wherein a surface of the semiconductor substrate is a (100) crystallographic surface, and
   to form at least one of said at least one first conductivity type inter-pixel isolation region in the second step, first conductivity type impurity ions are ion-implanted from a direction that coincides with a normal to the surface of the semiconductor substrate.

3. The manufacturing method of a solid-state imaging device according to claim 1,
   wherein a center of said at least one overflow barrier region is 3 µm or more below the surface of the semiconductor substrate.

4. The manufacturing method of a solid-state imaging device according to claim 1,
   wherein first conductivity type impurity ions are implanted from a second direction which is different from the first direction and in which channeling occurs with less frequency than in the first direction to form first conductivity type regions located at deep positions in the semiconductor substrate, and
   first conductivity type impurity ions are implanted from the first direction in which channeling occurs to form first conductivity type regions located at shallow positions in the substrate.

5. The manufacturing method of a solid-state imaging device according to claim 4,
   wherein the semiconductor substrate comprises an epitaxial substrate and an epitaxial layer formed on the epitaxial substrate; and
   the manufacturing method comprises the steps of:
      forming the first conductivity type regions located at deep positions in the semiconductor substrate in the epitaxial substrate;
      forming the epitaxial layer; and
      forming the first conductivity type regions located at shallow positions in the substrate in the epitaxial layer.

6. The manufacturing method of a solid-state imaging device according to claim 2,
   wherein, to form said at least one first conductivity type overflow barrier region in the first step, first conductivity type impurity ions are ion-implanted from a direction that is inclined from the normal to the surface of the semiconductor substrate by a prescribed angle.

7. The manufacturing method of a solid-state imaging device according to claim 3,
   wherein said at least one first conductivity type overflow barrier region has a multilayer structure, the multilayer structure comprising: an upper, first overflow barrier region; and a lower, second overflow barrier region which is higher in impurity concentration than the first overflow barrier region, and
   the first and second overflow barrier regions are formed by performing ion implantation from a second direction which is different from the first direction and in which channeling occurs with less frequency than in the first direction.

8. The manufacturing method of a solid-state imaging device according to claim 3,
   wherein the second conductivity type region comprises a plurality of regions having different impurity concentrations.

* * * * *